United States Patent
Greenman et al.

[19]

[11] Patent Number: 5,832,598
[45] Date of Patent: Nov. 10, 1998

[54] METHOD OF MAKING MICROWAVE CIRCUIT PACKAGE

[75] Inventors: Norman L. Greenman, Phoenix; Jorge M. Hernandez, Mesa, both of Ariz.; M. P. Ramachandra Panicker, Camarillo, Calif.

[73] Assignee: Circuit Components Incorporated, Tempe, Ariz.

[21] Appl. No.: 742,919

[22] Filed: Nov. 1, 1996

Related U.S. Application Data

[62] Division of Ser. No. 398,586, Mar. 2, 1995, abandoned.

[51] Int. Cl.$^6$ ............................................ H05K 3/34
[52] U.S. Cl. ........................... 29/840; 29/832; 29/852; 333/246; 333/247
[58] Field of Search ........................... 29/840, 841, 832, 29/852; 333/26, 247, 246

[56] References Cited

U.S. PATENT DOCUMENTS

| | | |
|---|---|---|
| 3,663,868 | 5/1972 | Noguchi et al. . |
| 4,276,558 | 6/1981 | Ho et al. .............................. 333/247 X |
| 4,875,087 | 10/1989 | Miyauchi et al. .................. 333/247 X |
| 5,014,115 | 5/1991 | Moser ................................. 333/247 X |
| 5,023,624 | 6/1991 | Heckaman et al. . |
| 5,202,648 | 4/1993 | McCandless ............................... 333/26 |
| 5,422,615 | 6/1995 | Shibagaki et al. .................. 333/247 X |
| 5,450,046 | 9/1995 | Kosugi et al. ......................... 333/26 X |

FOREIGN PATENT DOCUMENTS

| | | |
|---|---|---|
| 0 331 289 | 9/1989 | European Pat. Off. . |
| 2507409 | 12/1982 | France . |
| 3934224 A1 | 1/1991 | Germany . |
| 55-166941 A | 12/1980 | Japan . |
| 59-099745 A | 6/1984 | Japan . |

*Primary Examiner*—Carl J. Arbes
*Attorney, Agent, or Firm*—Fishman, Dionne, Cantor & Colburn

[57] ABSTRACT

A low cost microwave circuit package having high performance characteristics is disclosed. The package operates in the frequency range up to 90 GHz while requiring less space on the printed circuit board. Space savings is provided by small components and the leadless design of the package. Taking the place of leads is a ball grid array and RF ports. An unlimited number of layout designs are possible within an [s] matrix close to $$\begin{bmatrix} 0 & 1 \\ 1 & 0 \end{bmatrix}$$

within the operating frequency band of the package, for any pair of signal transmission ports.

38 Claims, 7 Drawing Sheets

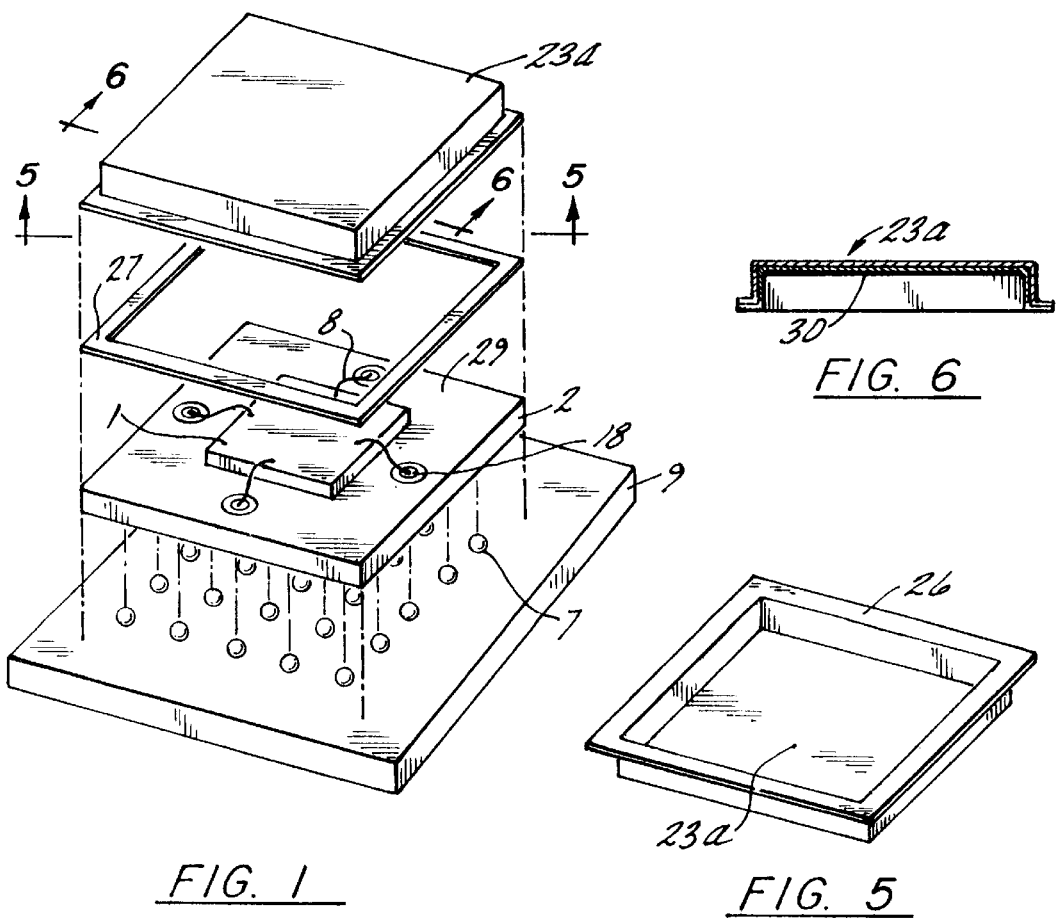
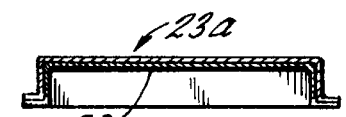
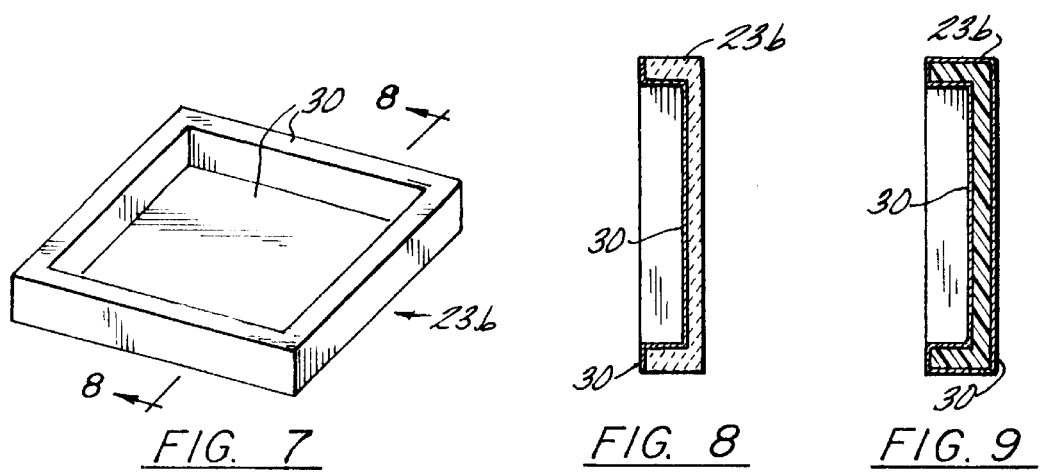

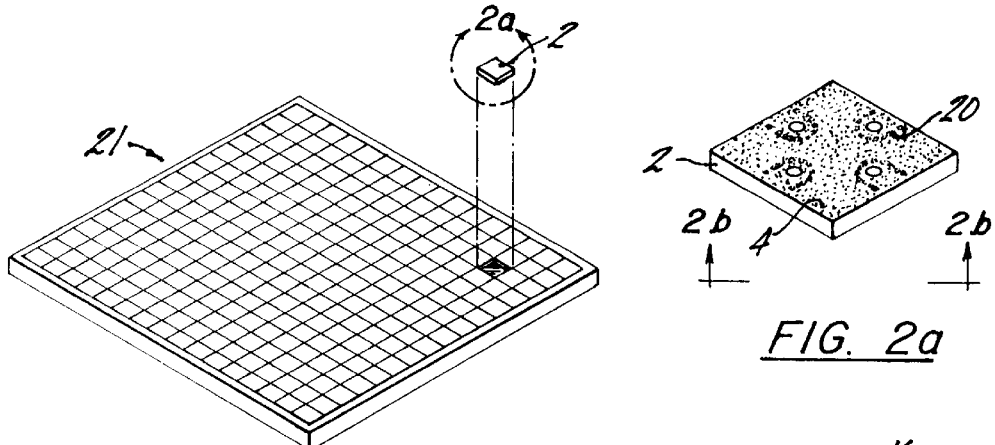
FIG. 2
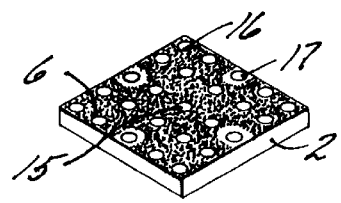
FIG. 2a
FIG. 2b
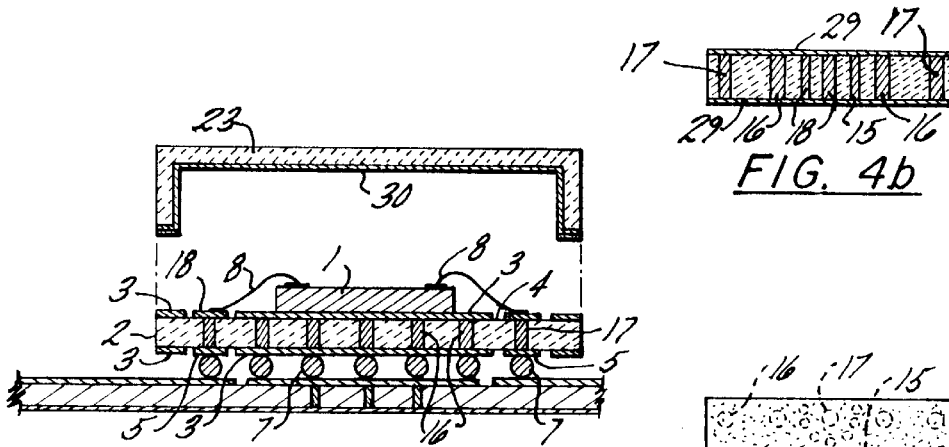
FIG. 4
FIG. 4b
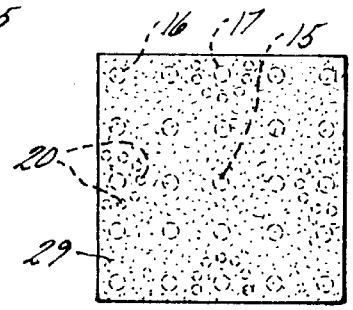
FIG. 4a

METHOD OF MAKING MICROWAVE CIRCUIT PACKAGE

This is a divisional of application Ser. No. 08/398,586, filed on Mar. 2, 1995, now abandoned.

BACKGROUND OF THE INVENTION

1. Field of the Invention

The invention relates to the field of packaging for Microwave Microcircuits (hereinafter Microwave Circuits). More particularly, the invention is directed to the circuits operating in the frequency range up to 90 GHz, for applications such as those found in Radar, Counter-Intelligence systems, Personal Communications Services and Intelligent Vehicle Highway systems among others.

Currently, there are emerging applications that require operating frequencies up to 77 GHz and higher.

2. Prior Art

Applications especially in the frequency range from 2.0 GHz and higher generally depend on GaAs microwave integrated circuits. An important drawback of the present available package technologies is that they impose a strong limitation on the ability of the system designer to filly utilize the capabilities of the GaAs microcircuit.

Present day packages, especially in the 5–12 GHz frequency range, were developed basically for Military and Aerospace applications, where cost is generally not of prime concern. The packages are generally complex and expensive.

Prior art packages are of leaded design and in order to be effective for their intended purpose, utilize expensive materials and manufacturing processes.

For example, extensive use is made of glass-to-metal seals, machined metallic cases, expensive alloys (e.g. Be O, W, MoMn, Cu W, Kovar, etc.) and large amounts of gold plating.

Other available prior art packages are based on an alumina cofired process which is generally cost effective, but has serious drawbacks. In that process, green cast alumina is punched or drilled providing vias to be filled with refractory metal pastes. Circuit traces and pads are then screen printed on the alumina using refractory metal inks (MoMn or Tungsten). Frequently multiple layers of punched and printed green alumina are stacked to form the package structure. Then, the entire assembly is sintered (cofired) to densify all the components. Cofiring causes shrinkage of the green alumina and the package structures. Shrinkage in itself is not necessarily problematic. However, the amount of shrinkage is not uniform throughout the package due to the different via and circuit trace density on different areas of the same. This makes the final location of the vias and traces difficult to control. Strict control of these locations as well as absolute dimensions of vias and traces is extremely important in applications from about 12 GHz and higher frequencies, due to the smaller wavelength as frequency increases. Precise control of geometry and dimensional tolerances is vital for the performance of the package.

Moreover, to make the package cost effective, it may be necessary to integrate passive components (R,L,C) into the package.

Since this cannot generally be achieved with the cofiring process, in addition to the drawbacks stated herein above, the cofiring process is not an economically viable approach to fabricating packages to operate in the 12 GHz and above frequency range.

Although the above described packages of the prior art have satisfied the needs of the Military market and some other applications, the rapidly growing high volume commercial markets in wireless Personal Communications Services, Intelligent Highway Vehicle Systems and other emerging markets are demanding more and more cost effective products.

Therefore, there is a very strong need for the availability of high performance, very flat, low cost, reliable, small size, height and weight microwave packages. The disadvantages and limitations of present day leaded packages, i.e., cost, limited frequency performance, etc., are greatly reduced or eliminated by the packages of the present invention.

SUMMARY OF THE INVENTION

The above-discussed and other drawbacks and deficiencies of the prior art are overcome or alleviated by the microwave microcircuit circuit package of the present invention.

The invention overcomes the drawbacks of the prior art by operatively attaching a microwave circuit to a prefired single layer ceramic substrate having precisely located vias, a Ball Grid Array on the bottom of the substrate and a connection surface on a top surface of the substrate. The microwave circuit is positioned atop the substrate and electrically connected in conventional ways to the substrate (for example, wire bonding). A cover which may be of a number of compositions, and which may be coated with a thin layer of a conductive material, is bonded to the substrate primarily either by welding, solder or by electrically conductive adhesives. The package may be hermetically sealed and is operably attachable to the mother board by the Balls of the Ball Grid Array. Thus, it will be appreciated that the package will require less space on the mother board because of the absence of leads. The space savings is due both to the leadless, ball grid array design and the small physical size features in the package necessary for up to 90 GHz operating frequency range. In addition the package is flatter than other prior art packages. This is particularly important for assembly of very thin, delicate GaAs devices currently emerging for use. Also, the package is lighter than other leaded packages, a very desirable attribute in today's personal communication device market and in the trend towards miniaturization. Several embodiments are disclosed.

The above-discussed and other features and advantages of the present invention will be appreciated and understood by those skilled in the art from the following detailed description and drawings.

BRIEF DESCRIPTION OF THE DRAWINGS

Referring now to the drawings wherein like elements are numbered alike in the several FIGURES:

FIG. 1 is a perspective schematic exploded view of the invention;

FIG. 2 is a perspective view of a panel of substrates for the invention;

FIG. 2a is a perspective view of a top surface of the individual substrate unit exploded up from FIG. 2;

FIG. 2b is a perspective view of a bottom surface of the individual substrate unit exploded up from FIG. 2;

FIG. 4 is a cross section view of a package of the invention;

FIG. 5 is a perspective view of a metal lid;

FIG. 6 is a cross section of FIG. 5;

FIG. 7 is a perspective view of a plastic or ceramic lid;

FIG. 8 is a cross section of FIG. 7 with metalization on an interior surface thereof;

FIG. 9 is a cross section of FIG. 7 with metalization on the entirety of the lid;

DETAILED DESCRIPTION OF THE PREFERRED EMBODIMENTS

Figure 11:
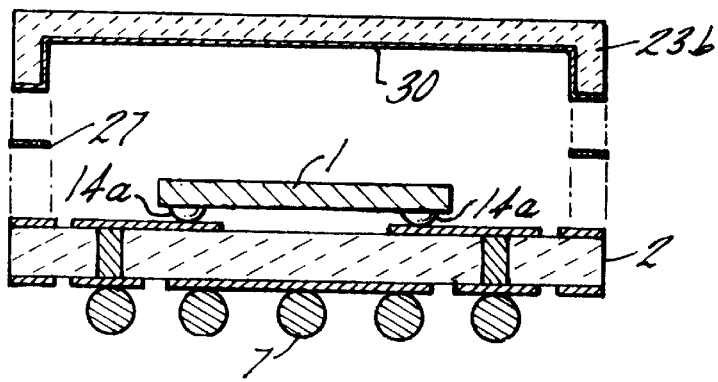
FIG. 11 is a cross section of the package of the invention utilizing IC chip bump technology.
Figure 12:
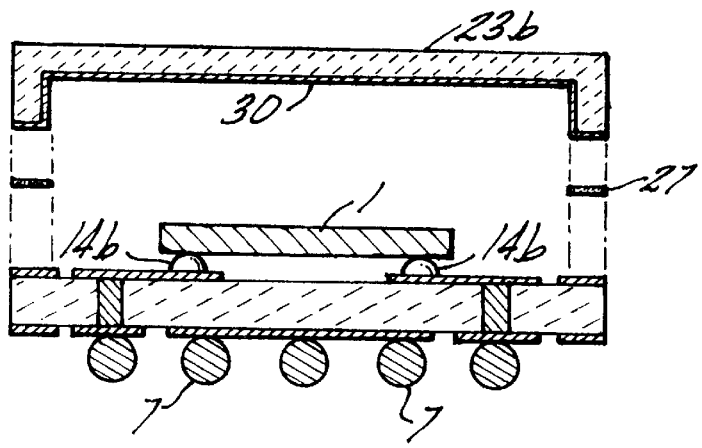
FIG. 12 is a cross section of the package of the invention utilizing an alternate package bump technology.

In a preferred embodiment of the present invention, referring to FIGS. 1 and 4, a prefired substrate 2 is provided which preferably contains a plurality of precisely located laser drilled vias. The substrate is most preferably composed of alumina (aluminum oxide $Al_2O_3$) or aluminum nitride ceramic which has been fully sintered prior to being laser drilled. It should be noted that the substrate technology described herein is more fully described in U.S. Pat. Nos. 4,942,076 and 5,089,881 the entire contents of which are incorporated herein by reference. The substrate 2 further contains a predesigned pattern of traces (and/or pads) 3 on a microwave circuit surface 4 thereof and a preselected pattern of ball connection pads 5 on surface 6 of substrate 2. Balls 7 are attached to pads 5 by electrically conductive methods. Substrate 2 and balls 7 provide the platform on which the microwave microcircuit 1 is mounted. The microwave circuit 1 is also electrically connected to traces (and/or pads) 3 by leads (wire bonds) 8 (or bumps 14; see FIGS. 11 and 12). It will be noted however that leads are not required for connection of the package to the mother board 9. Consequently, much space is saved on the board 9 allowing for lighter and smaller electronic devices.

Referring to FIGS. 2, 2a and 2b, the substrate itself is easily processed in panel 21 form which substantially lowers costs of individual substrate units 2. Panels 21 may contain typically from 60–256 substrate units, however, it is certainly possible to produce fewer or more units than the specified range depending upon the size of individual units and the size of the panel 21. Panel 21 processing is also desirable because as one skilled in the art will recognize, the higher the frequency intended the smaller the circuits themselves, and the package to house them, need be. Therefore, for appllications in the very high operating frequencies, many substrate units can be processed in a single panel.

The most preferred substrate material is 96% alumina, however higher purity alumina grades, glass ceramic, aluminum nitride and other materials are acceptable provided that the dielectric constant and dielectric losses of the material are comparable to those of the preferred material. Moreover, other properties such as modulus of elasticity, hardness, glass transition point, etc. are considerations for their compatibility with the processing conditions of the fabrication process. Furthermore, user conditions must be considered, e.g., microwave circuit attachment, wire bonding, encapsulation, etc.

Figure 3:
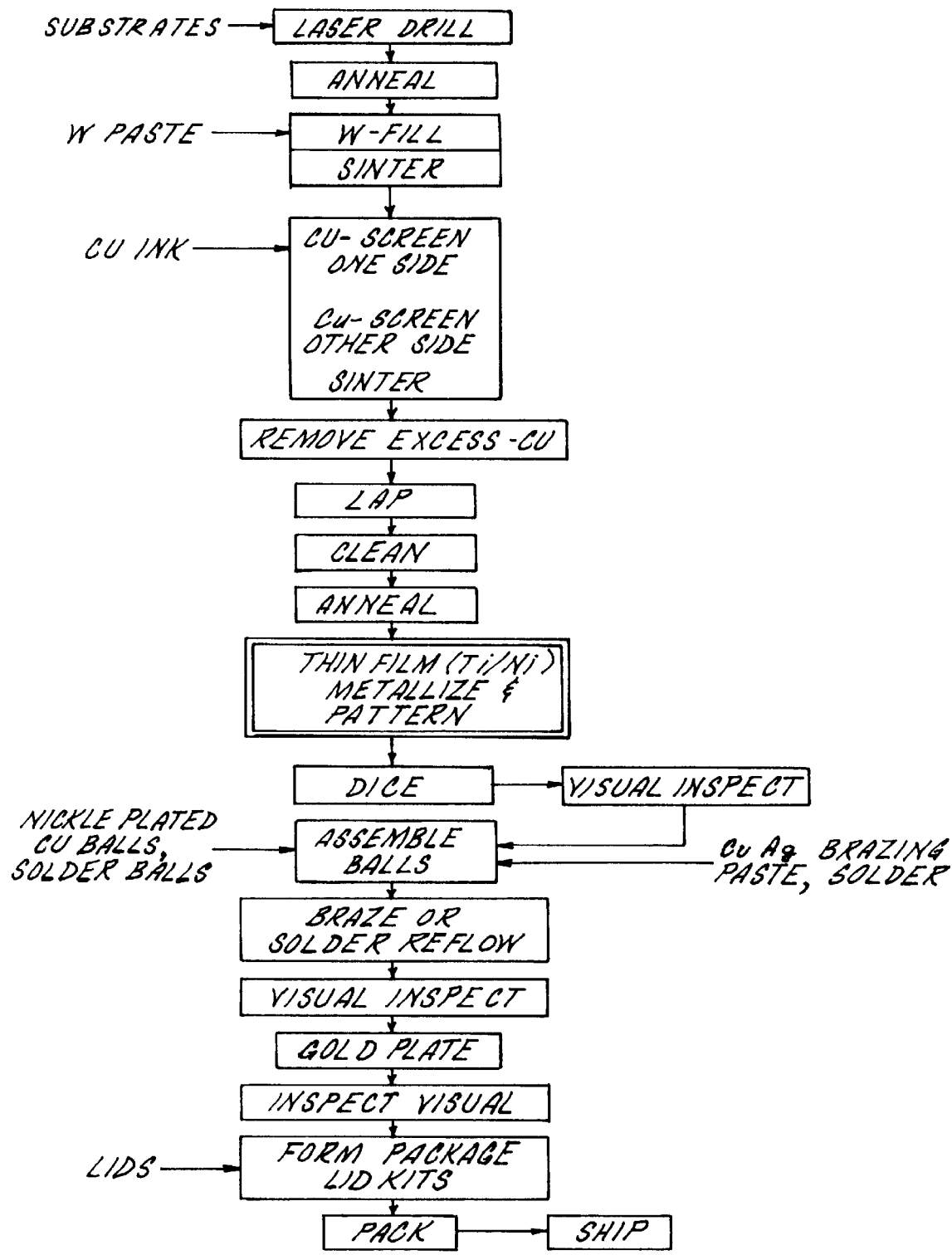
FIG. 3 is a flow chart of the method of making the invention.

Referring to FIG. 3 a flow chart of the preferred process for fabrication of the packages is illustrated. It will be appreciated that the steps listed on the flow chart from drilling through annealing after lap and clean is the subject of Panicker et al which has been previously incorporated herein by reference.

Once the bulk panel 21 is fabricated, a thin film metallization process is employed to provide traces 3 for electrical connection. In the most preferred embodiment a vapor deposition process such as Enhanced Ion Plating (EIP), magnetron sputtering, straight physical vapor deposition, chemical vapor deposition or low temperature arc vapor deposition (LTAVD) is employed. Alternatively, layers of metal can also be applied by thick film, screen print and firing of metallic pastes such as inert atmosphere (N2, forming gas) fireable Nickel, copper and other pastes. The pastes preferably are printed with very fine stainless steel mesh (400) screens for adequate pattern definition. This is particularly important at the 20 GHz and higher frequency ranges.

The preferred metallization 29 system utilizes titanium as an adhesion promoter. The promoter is preferably applied in a thickness of in the range of about 100 to 3000 Angstroms and most preferably about 1,000Å (angstroms). Over the titanium a layer of preferably 1.5–3.0 microns of Nickel is deposited. It will be appreciated, however, that other metal combinations are equally effective including tungsten-nickel, molybdenum-nickel, choromium nickel, chromium copper nickel, or combinations thereof The effectiveness of the different combinations of metals is due to the final gold plated layer on top of them. This is so due to the skin depth penetration effect of electromagnetic fields on metals. At the operating frequencies of the microwave packages, the electric currents will flow essentially on the surface of the gold plated layer. Therefore, the requirements of very high electrical conductivity on the base metals is not as demanding as it would be at lower frequencies. Consequently, the mentioned metal combinations provide adequate electrical conductivity.

It is further important to note that the processing conditions planned after the metallization of the substrate will affect the selection of metals combinations. More specifically, patterning, for example by a photoresist/etching process; ball attachment, either by a copper/silver or AuGe brazing process in an inert or slightly reducing atmosphere or when the balls are attached by a solder reflow process, etc. require consideration of the metal combinations utilized in the metallization process for each combination's immunity to the processing outlined. Of like significant importance, care must be taken to avoid placing a metal having a high coefficient of diffusion into gold at relatively low temperatures immediately beneath the final gold plating; copper is an example of a metal not suited to be gold plated in this application. The phenomenon of copper diffusion into gold is well known in the industry, and among other problems it causes weakening and corrosion of wire bonded joints of microcircuits to the gold plated substrates.

The above considerations also apply to thick film pastes where they are selected for use.

The preferred method for producing the invention includes a number of steps set forth hereunder.

Figure 13:
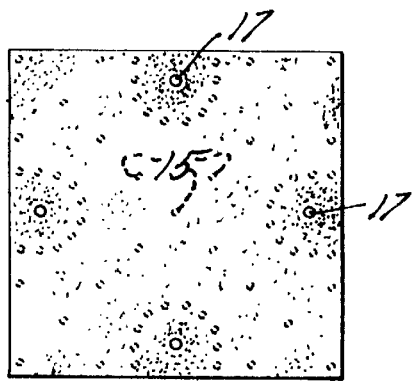
FIG. 13 is a plan view of one layout of the substrate of the invention.
Figure 15:
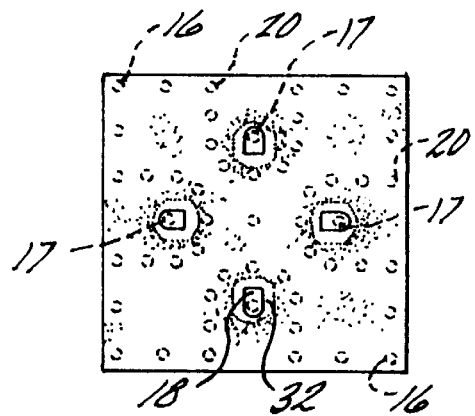
FIG. 15 is an alternate plan view of a layout of the substrate of the invention.
Figure 14:
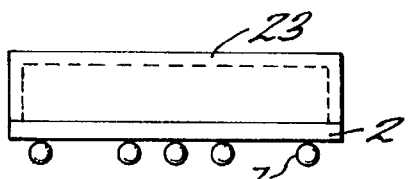
FIG. 14 is an end view of FIG. 13.
Figure 14A:
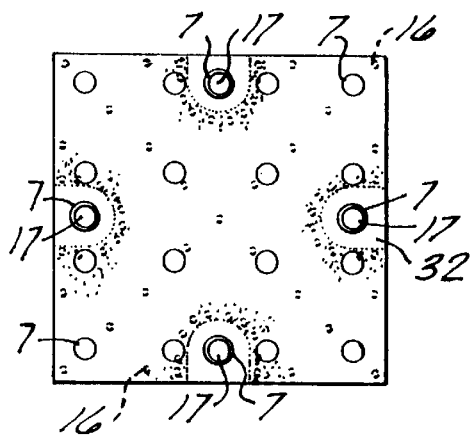
FIG. 14a is a bottom view of FIG. 13.
Figures 17, 17A:
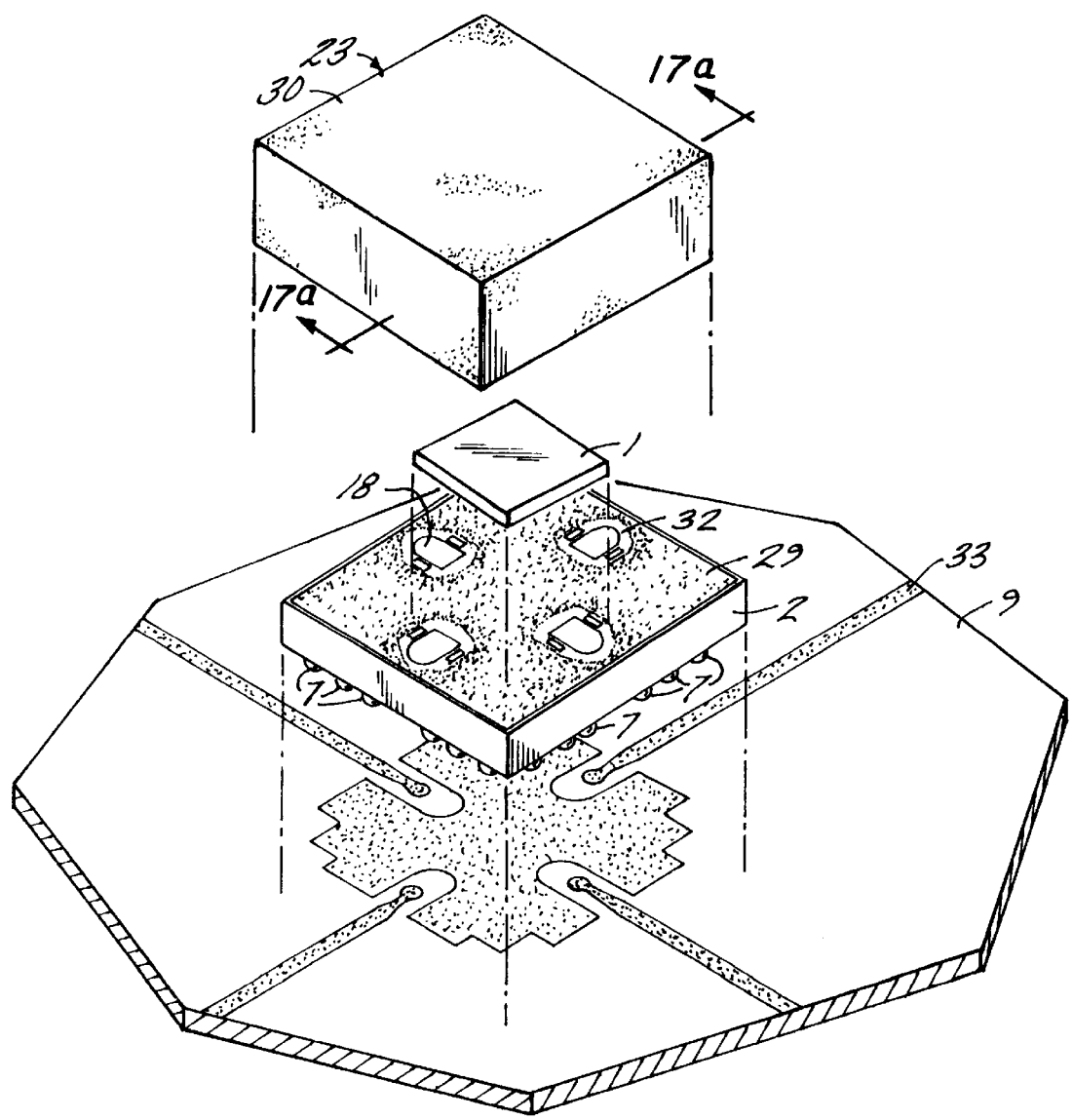
FIG. 17 is a perspective exploded view of one package of the invention.
FIG. 17a is a cross section taken along section line 17a—17a in FIG. 17.

The first step begins with a ceramic polished substrate 2 containing both thermal vias 15 and ground vias 16 as well as signal/DC vias 17 (see FIGS. 2a and 2b). The substrate 2 is, as noted above, comprised of preferably 96% alumina or higher purity. It is also acceptable, however, to utilize 92% Alumina, Aluminum Nitride (AlN), glass ceramic or other material of similar electrical properties which is also compatible with via fill (Cu—W) and sintering processes. All of the vias in substrate 2 are preferably filled with Cu—W composite material which possesses desirable electrical conductivity properties and a coefficient of thermal expansion substantially similar to that of the substrate 2 material. Circuit surface 4 and PCB connection surface 6 of substrate 2 are then polished to a finish of at least about 20 microinches Ra for control of electrical properties of interconnection structures on the substrate 2. Signals are brought in the PCB to the RF port balls by means of interconnection structures such as stripline, microstrip or coplanar waveguide. A coplanar waveguide configuration is schematically illustrated in FIG. 17 as numeral 33 on PCB 9. Many different via pattern geometries and shield loop 20 patterns are possible for use with the present invention. Those shown in the drawings are by way of illustration only; there are virtually no limits to patterns except to maintain the scattering matrix values of the pairs of RF ports as close as possible to $S_{11}=0$, $S_{22}=0$, $S_{12}=1$, $S_{21}=1$. FIGS. 13 and 14 show an example of patterns of vias 15, 16, 17 and loops 20 and metalization free areas 32 which are effective for various applications of the present invention.

Following preparation of the polished ceramic substrate, flat metallization of both surfaces of the substrate is undertaken (seen in FIGS. 4, 4a and 4b). The preferred metallization procedure includes a first adhesion promoter layer of about 1000 Angstroms of titanium followed by a layer of nickel of about 1.0 to about 3.0 microns. It will be appreciated that these are minimum ranges for economic reasons; thicker deposits are effective if desired. It will also be appreciated that other metal combinations, for example, molybdenum-nickel (Mo—Ni), Ni alone, etc. can be employed with the proviso that adhesion of the metal to the substrate is such that after the subsequent processing to convert the substrate to a Ball Grid Array package the ball bond strength to the package will remain within accepted industry standards. It is also important criteria that the metal selected will bond with the final gold plate applied thereover, that the metal will not diffuse into the gold concomitant any of the processing conditions and that the gold to metal bond will not degrade in any of the expected conditions of processing to a functional microwave circuit or in use in a system application.

Subsequent to metallization the metalized substrate is patterned by preferably a photo resist-expose-develop-etch process which is known to the art. Alternatively, the substrate may be masked at the time of metallization to achieve the desired patterning. Patterning provides electromagnetic structures intended to provide DC Bias, RF signal input and output, a microwave circuit attachment area, ground planes, shields, capture pads for vias and any other conductive features required for proper functioning of the package. It is of course important to guard against interference with the operation of the microwave circuit. As is known to the art the parameters required to ensure that all of the foregoing occurs is mathematically described in terms of the "S" matrix for the package as a two-port passive, linear, lossless device as follows:

$$[s] = \begin{bmatrix} 0 & 1 \\ 1 & 0 \end{bmatrix},$$

for every pair of ports used for signal transmission, within the operating frequency band of the package. This is the configuration governing formula which all preferred electromagnetic structure layouts must meet. It will be understood however that devices can be made which deviate from the preferred formula, merely suffering from reduced frequency performance.

Although the foregoing may be carried out on a single substrate blank, the preferred method is to process a larger panel 21 format which typically is in the range of about 4.5 inches by 4.5 inches (FIG. 2). The thickness of the array material is dictated by the operating frequency, with thinner substrate materials being required for higher operating frequency. Formation of the metalized and patterned substrates in panel format is economically superior to individual forming without significant loss in performance. This benefits the market in lower price per unit cost. Upon completion of substrate metallization 29 and patterning the array is diced thus providing individual substrates 2 ready for construction into packages.

To the PCB connection surface 6 (FIG. 2b) must be attached balls 7. Construction of the balls 7 and attachment thereof is the next step in production of the package.

Referring to FIG. 4, balls 7 are most preferably constructed of copper plated with nickel because of the inexpensive natures of the materials and the compatibility of the selected material with a selected attachment process. The preferred attachment process is via a eutectic AgCu brazing material with which the nickel plated copper balls are quite compatible. Further benefits resulting in the preferred status of these balls and attachment material is low cost and easy plateability with gold. It should be noted that other materials compatible with AgCu eutectic material (or CuAg material) include solid nickel, silver, silver copper and others which will be appreciated by those of skill in the art. The processing conditions for such material combinations are approximately 800° C. for 10.0 minutes in a Nitrogen Atmosphere. The components selected therefore must be capable of withstanding, without degradation, the conditions of such processing.

Other ball construction materials are generally dictated by the attachment processes to be utilized. AuGe and eutectic AuSi attachment materials are also preferred thereby dictating any electrically conductive material compatible with the brazing conditions of these materials.

Additional preferred ball materials include 95% lead and 5% tin alloy; 90% lead 10% tin alloy; or any other alloy with a melting point significantly higher than the conventional eutectic 63/37 lead-tin (PbSn) alloy commonly employed in electronic soldering operations.

Figure 15A:
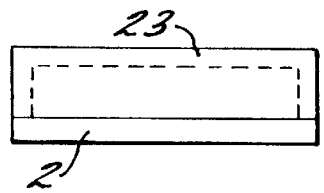
FIG. 15a is an end view of FIG. 15.
Figure 15B:
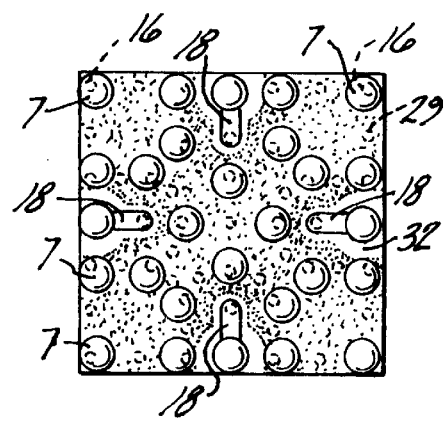
FIG. 15b is a bottom view of FIG. 15.
Figure 16:
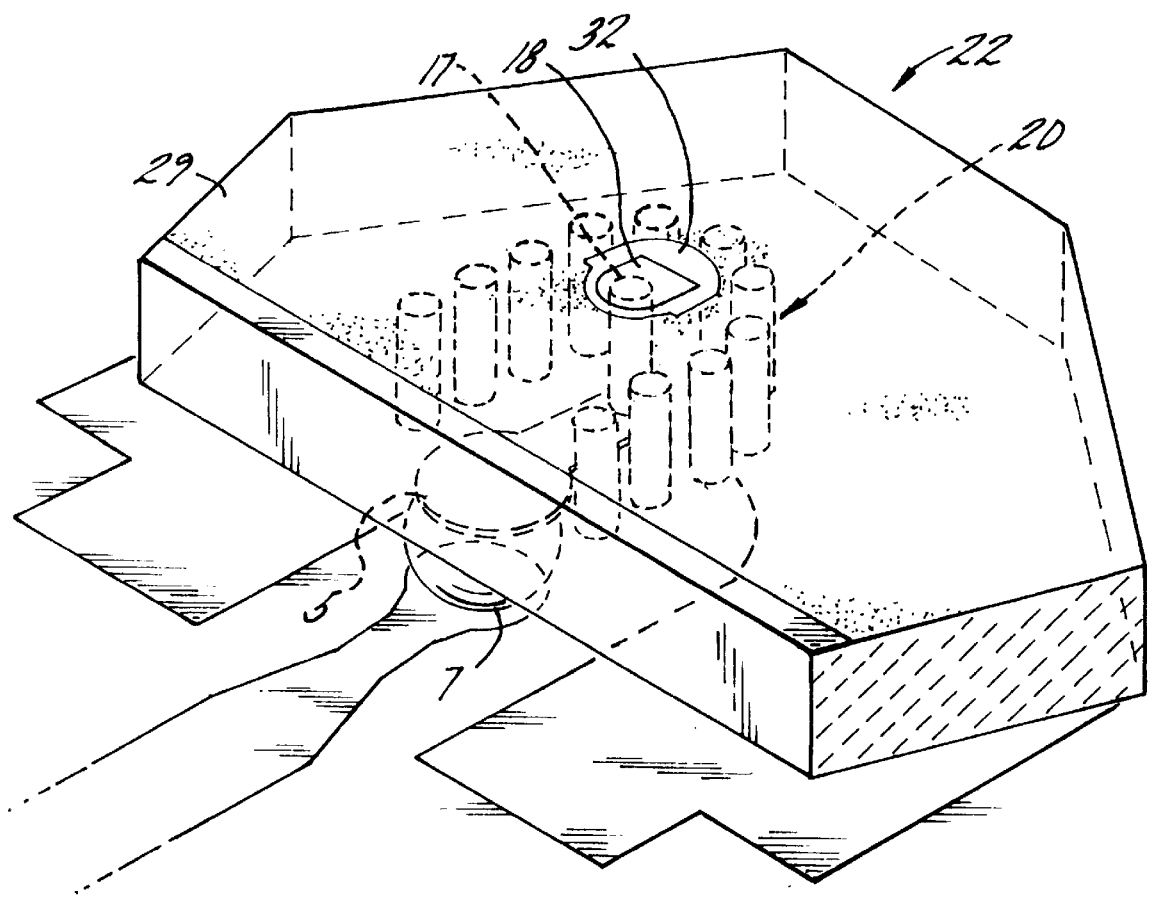
FIG. 16 is an enlarged perspective view of a RF port of the invention.

Clear to one of skill in the art, there is an unlimited number of possible configuration of balls on the substrate; an example of a configuration is illustrated in FIG. 15b.

Subsequent to ball attachment in the predetermined configuration, the packages are gold plated employing preferably a barrel plating process both for protection of the components and for wire bondability at the RF port 22, signal and DC pads 18 and 19, respectively, (FIGS. 1, 4 and 17). The microwave circuit 1 is then wire bonded to the substrate. Connection of microwave circuit 1 is further discussed hereunder.

Referring now to FIGS. 5–9 lids 23 constructed for bonding, by a number of methods, to the substrate over the operably connected microwave circuit 1 to provide an electromagnetic shield to control impedance of the circuit and protect the microwave circuit 1 from physical and environmental damage are discussed. Several options exist for materials, profiles and types of bonding processes. In generally the choice of material and method of bonding to the package substrate is closely related to the degree of hermeticity required for the projected application and the cost incurred.

The preferred materials for forming the lid include plastic and ceramic. Among suitable plastics, epoxy molding compounds (whether semiconductor grade or other), polyphenilene sulphide (PPS) Ultem (GE tradename) and other common engineering themosets and thermoplastics are acceptable materials. Among ceramic materials, alumina is most preferred since it is the preferred material for the substrate 2. Employing the same material for both parts ensures a matched coefficient of thermal expansion (CTE). Other ceramic materials considered desirable include Forsterite, Cordierite, glass ceramic, and other ceramic materials with a coefficient of thermal expansion similar to the substrate material. Moreover, a further preferred embodiment employs deep drawn Kovar or Nickel as lid materials. Also, W—Cu and AlSiC lids made by powder metallurgy methods are adequate.

Referring to FIGS. 5–9, regardless of the type of material employed, the lids 23 must be conductive or conductively plated 30. In the case of Kovar or nickel lids 23a the material is preferably plated on the entire surface with gold for superior conductivity and corrosion protection. The attachment process for a Kovar or Nickel lid is by welding or by means of a AuGe solder preform 27 (shown in FIGS. 1, 11 and 12) placed upon the attachment area 26 of Kovar or Nickel lids 23a, where such a preform is employed it is important to carefully consider the solder versus metal selected for chemical and galvanic compatibility. Moreover a solder material having a melting temperature not deleterious to the other components of the assembly must be selected. It will be appreciated by those of skill in the art that the balls 7, microwave circuit 1, substrate 2, etc. as well as the gold plating, all have a relatively low temperature threshold for damage. The selection of many alloys would be detrimental to the package and therefore economically undesirable. In the case of the plastic or ceramic lids 23b metallization 30 can be carried out by applying a thin layer of metal (e.g., nickel or other suitable metal) by preferably a low temperature arc vapor deposition process prior to gold plating.

Electroless plating and other conventional plastic plating processes are also acceptable. It should be noted that these processes plate the entirety of the plastic lid (see FIG. 9). This is not, in itself, problematic for the function of the lid, however it can increase materials cost without benefiting the arrangement.

Adhesives preferred for bonding the lid 23 to substrate 2 are electrically conductive and include silver filled epoxy, polyimide or other adhesives.

Figure 10:
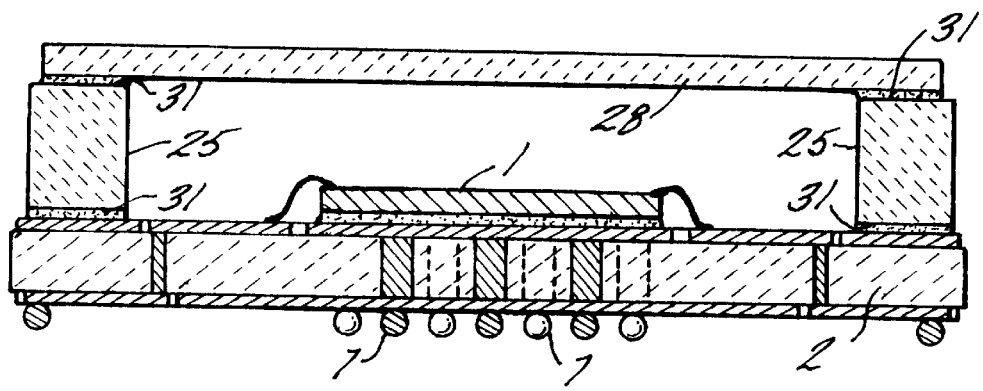
FIG. 10 is a cross section of an alternate embodiment of the lid.

An alternative embodiment of the invention employs a lid 23c of two pieces (see FIG. 10). Spacer 25 is attached to substrate 2 in any of the above described ways and plate 28 is then attached to spacer 25 in a similar way, the attachment material is illustrated as 31 in FIG. 10. For the arrangement to be effective, it, like the lids discussed above, must be conductive. This lid 23c can be made metalized in all of the same ways.

Referring now to FIGS. 1, 4, 10, 11 and 12, the microwave circuit 1 is electrically connected to surface 4 of substrate 2 by one of two preferred methods. In the first method the device is connected using wire bonds 8 from the microwave circuit 1 to the substrate 2. This is a conventional attachment arrangement for microcircuit connections to packages."

Also employable in the present invention is "bump" (or flip chip) technology, where bumps are placed either on the microwave circuit 1 or on the traces 3 of surface 4 of substrate 2. In either case, both of which being illustrated in FIGS. 11 and 12, the bumps electrically connect the chip to the package. Bumps 14 on the microcircuit are generally constructed using PbSn solder or by vapor deposition of Cr, Cu and Au. Bumps on the package can be produced using the same procedure as for those on the microwave circuit surface. Employing bump technology can in many cases provide even smaller packages which is a desirable result. Also, better high frequency performance is achieved, due to the absence of inductive effects introduced by the wire bonds.

As will, of course, be appreciated by those of skill in the art, the microwave circuit is fully attached to the desired points before attachment of the lid.

As has been stated hereinabove, the particular arrangements of all of the component elements of the invention can be many. The guiding factor is that the [s] matrix must be as close to $$[s] = \begin{bmatrix} 0 & 1 \\ 1 & 0 \end{bmatrix}$$

as possible within the intended operating frequency range for every pair of signal transmission ports. Performance of the packages depends upon their physical size and their ability to, without signal reflection, or unintended coupling to other ports, transition waves from the PC Board, through the balls, vias, pads, to the microwave circuit and back to the PCB.

Referring to FIGS. 13–17 some preferred arrangements are depicted by way of illustration not limitation.

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. A method for producing a microwave circuit package comprising the steps of:
   a) forming a discrete substrate unit by prefiring a substrate bulk material;
   b) preparing connective elements for the substrate to connect the substrate to a PC board;
   c) electrically attaching said connective elements to a first surface of the substrate;
   d) electrically attaching a microwave circuit to a second surface of the substrate; and
   e) attaching a cover to said substrate around and over said microwave circuit to encapsulate said microwave circuit between said cover and said substrate.

2. A method for producing a microwave circuit package as claimed in claim 1 wherein said forming further includes:
   a) drilling said material for via holes;
   b) filling said via holes with a conductive material;
   c) sintering said substrate material with filled vias;
   d) screening both sides of said material with a conductive material;

e) sintering and removing excess conductive material;

f) thin metalize and pattern said substrate; and g) dicing said bulk material into individual discrete substrate unit.

3. A method for producing a microwave circuit package as claimed in claim 2 wherein said substrate material is ceramic.

4. A method for producing a microwave circuit package as claimed in claim 3 wherein said ceramic is selected from the group consisting of alumina, aluminum nitride and glass ceramic.

5. A method for producing a microwave circuit package as claimed in claim 2 wherein said drilling step is carried out with a laser.

6. A method for producing a microwave circuit package as claimed in claim 2 wherein said filling step comprises:

a) preparing a via fill composition; and b) applying said composition into the via holes until a solid conductive structure is present within an entire length of the via holes.

7. A method for producing a microwave circuit package as claimed in claim 6 wherein said composition includes tungsten.

8. A method for producing a microwave circuit package as claimed in claim 6 wherein said composition includes copper.

9. A method for producing a microwave circuit package as claimed in claim 6 wherein said composition includes a mixture of tungsten and copper.

10. A method for producing a microwave circuit package as claimed in claim 2 wherein said step of screening is carried out with a copper ink.

11. A method for producing a microwave circuit package as claimed in claim 2 wherein said step of thin metalizing is carried out by coating each surface of said substrate with titanium.

12. A method for producing a microwave circuit package as claimed in claim 2 wherein said step of thin metalizing is carried out by coating each surface of said substrate with nickel.

13. A method for producing a microwave circuit package as claimed in claim 2 wherein said step of thin metalizing is carried out by coating each surface of said substrate with a bilayer of titanium and nickel.

14. A method for producing a microwave circuit package as claimed in claim a 2 wherein said thin film metalizing is effected by low temperature arc vapor deposition.

15. A method for producing a microwave circuit package as claimed in claim 2 wherein said thin film metalizing is effected by electroless plating.

16. A method for producing a microwave circuit package as claimed in clam 2 wherein said thin film metalizing is effected by magnetron sputtering.

17. A method for producing a microwave circuit package as claimed in claim 2 wherein said thin film metalizing is effected by straight physical vapor deposition.

18. A method for producing a microwave circuit package as claimed in claim 2 wherein said thin film metalizing is effected by enhanced Ion plating.

19. A method for producing a microwave circuit package as claimed in claim 2 wherein said thin film metalizing is effected by chemical vapor deposition.

20. A method for producing a microwave circuit package as claimed in claim 1 wherein said substrate is thick film metalized.

21. A method for producing a microwave circuit package as claimed in claim 1 wherein said substrate is screen printed.

22. A method for producing a microwave circuit package as claimed in claim 2 wherein said step of dicing employs a laser to cut the bulk material into individual discrete substrate units.

23. A method for producing a microwave circuit package as claimed in claim 1 wherein the step of preparing connective elements further includes the step of creating a plurality of elements having a metallic base structure and a conductive plating.

24. A method for producing a microwave circuit package as claimed in claim 23 wherein said base structure is a ball.

25. A method for producing a microwave circuit package as claimed in claim 23 wherein said base structure is a column.

26. A method for producing a microwave circuit package as claimed in claim 1 wherein said step of electrically attaching said connective elements includes a process selected from the group consisting of brazing, soldering and adhering with adhesive.

27. A method for producing a microwave circuit package as claimed in claim 1 wherein the step of electrically attaching a microwave circuit includes the further steps of soldering or brazing a plurality of leads to the device and then soldering or brazing the plurality of leads, at an opposite end from the end brazed or soldered to the circuit, to the substrate.

28. A method for producing a microwave circuit package as claimed in claim 1 wherein the step of electrically attaching the microwave circuit to the substrate includes providing conductive bumps on a surface of the device nearest the substrate, said conductive bumps providing electrical contact between the device and a plurality of traces on the substrate.

29. A method for producing a microwave circuit package as claimed in claim 1 wherein the step of electrically attaching the microwave circuit to the substrate includes providing conductive bumps on a surface of the substrate nearest the device, said conductive bumps providing electrical contact between the device and a plurality of traces on the substrate.

30. A method for producing a microwave circuit package as claimed in claim 1 wherein the step of attaching a cover to said substrate is by utilizing a process selected from the group consisting of brazing, welding and adhesive bonding.

31. A method for producing a microwave circuit package as claimed in claim 1 wherein said method further includes the step of conductively plating said cover on at least an interior surface thereof.

32. A method for producing a microwave circuit package as claimed in claim 31 wherein said conductive plating is selected from the group consisting of copper, gold, silver, nickel, titanium and combinations of these.

33. A method for producing a microwave circuit package as claimed in claim 31 wherein plating said cover is effected by low temperature arc vapor deposition.

34. A method for producing a microwave circuit package as claimed in claim 31 wherein plating said cover is by electroless plating.

35. A method for producing a microwave circuit package as claimed in claim 31 wherein plating said cover is by magnetron sputtering.

36. A method for producing a microwave circuit package as claimed in claim 31 wherein plating said cover is by straight physical vapor deposition.

37. A method for producing a microwave circuit package as claimed in claim wherein plating said cover is by enhanced ion plating.

38. A method for producing a microwave circuit package as claimed in claim 31 wherein plating said cover is by chemical vapor deposition.

* * * * *

UNITED STATES PATENT AND TRADEMARK OFFICE
CERTIFICATE OF CORRECTION

PATENT NO. : 5,832,598

DATED : November 10, 1998

INVENTOR(S) : Norman L. Greenman, et al

It is certified that error appears in the above-identified patent and that said Letters Patent is hereby corrected as shown below:

Column 9, line 42 delete "a" between "claim" and "2".
Column 10, line 61 insert --31-- between "claim" and "wherein".

Signed and Sealed this

Fourteenth Day of March, 2000

*Attest:*

Q. TODD DICKINSON

*Attesting Officer*   *Commissioner of Patents and Trademarks*